US009093607B2

(12) United States Patent
Gilet et al.

(10) Patent No.: US 9,093,607 B2
(45) Date of Patent: Jul. 28, 2015

(54) NANOWIRE-BASED OPTOELECTRONIC DEVICE FOR LIGHT EMISSION

(71) Applicant: Commissariat A L'Energie Atomique Et Aux Energies Alternatives, Paris (FR)

(72) Inventors: Philippe Gilet, Teche (FR); Anne-Laure Bavencove, Grenoble (FR)

(73) Assignee: Commissariat A L'Energie Atomique et Aux Energies Alternatives, Paris (FR)

( * ) Notice: Subject to any disclaimer, the term of this patent is extended or adjusted under 35 U.S.C. 154(b) by 62 days.

(21) Appl. No.: 13/726,929

(22) Filed: Dec. 26, 2012

(65) Prior Publication Data
US 2013/0112945 A1    May 9, 2013

Related U.S. Application Data

(63) Continuation of application No. PCT/FR2011/052078, filed on Sep. 12, 2011.

(30) Foreign Application Priority Data

Sep. 14, 2010  (FR) ..................................... 10 57330
May 18, 2011  (FR) ..................................... 11 54313

(51) Int. Cl.
*H01L 33/00*   (2010.01)
*H01L 33/32*   (2010.01)
(Continued)

(52) U.S. Cl.
CPC ................. *H01L 33/32* (2013.01); *H01L 33/06* (2013.01); *H01L 33/18* (2013.01); *B82Y 20/00* (2013.01); *H01L 33/08* (2013.01); *Y10S 977/762* (2013.01); *Y10S 977/95* (2013.01)

(58) Field of Classification Search
CPC ........ B82Y 20/00; H01L 33/06; H01L 33/08; H01L 33/18; H01L 33/32; Y10S 977/762; Y10S 977/95
USPC ............... 257/13, 72, 94, 253; 438/22, 29, 41
See application file for complete search history.

(56) References Cited

U.S. PATENT DOCUMENTS 7,521,274 B2 *  4/2009  Hersee et al. .................... 438/41
8,227,817 B2 *  7/2012  Pedersen et al. ................. 257/94
(Continued)

FOREIGN PATENT DOCUMENTS

GB        2 458 442 A      9/2009
WO     2008/079076 A1     7/2008
(Continued)

OTHER PUBLICATIONS

N.F. Gardner et al., "Blue-emitting InGaN—GaN double-heterostructure light-emitting diodes reaching maximum quantum efficiency above 200 A/cm$^2$," Applied Physics Letters 91, 243506 (2007).
(Continued)

Primary Examiner — Mohammed Shamsuzzaman
(74) Attorney, Agent, or Firm — Burr & Brown, PLLC

(57) ABSTRACT

A light-emitting diode is provided, including an active semiconductor area for the radiative recombination of electron-hole pairs having a plurality of nanowires, each made of an unintentionally doped semiconductor material, a first semiconductor area for radially injecting holes into each nanowire, the first semiconductor area being made of a doped semiconductor material having a first conductivity type and having a bandgap that is greater than the bandgap of the semiconductor material of the nanowires, and a second semiconductor area for axially injecting electrons into each nanowire, the second semiconductor area being made of a doped semiconductor material having a second conductivity type that is opposite to that of the first conductivity type.

6 Claims, 4 Drawing Sheets

(51) Int. Cl.
*H01L 33/06* (2010.01)
*H01L 33/18* (2010.01)
*B82Y 20/00* (2011.01)
*H01L 33/08* (2010.01)

(56) References Cited

U.S. PATENT DOCUMENTS

| | | | |
|---|---|---|---|
| 8,575,663 B2 * | 11/2013 | Lieber et al. | 257/253 |
| 8,669,125 B2 * | 3/2014 | Lowgren | 438/22 |
| 8,766,272 B2 * | 7/2014 | Yu et al. | 257/72 |
| 2006/0177952 A1 * | 8/2006 | Lambertini et al. | 438/29 |
| 2008/0305568 A1 | 12/2008 | Huang et al. | |
| 2009/0146142 A1 | 6/2009 | Kim et al. | |
| 2009/0266411 A1 * | 10/2009 | Habib et al. | 136/255 |
| 2010/0006817 A1 | 1/2010 | Ohlsson et al. | |
| 2011/0133060 A1 * | 6/2011 | Yu et al. | 250/214.1 |
| 2011/0180776 A1 | 7/2011 | Gilet et al. | |

FOREIGN PATENT DOCUMENTS

| | | |
|---|---|---|
| WO | 2008/079077 A2 | 7/2008 |
| WO | 2008/140611 A2 | 11/2008 |
| WO | 2009/087319 A1 | 7/2009 |
| WO | 2009/106636 A1 | 9/2009 |

OTHER PUBLICATIONS

D. Kapolnek et al., "*Anisotropic epitaxial lateral growth in GaN selective area epitaxy*," Applied Physics Letters 71, 1204 (1997), Abstract.

International Search Report mailed Jun. 1, 2012.

* cited by examiner

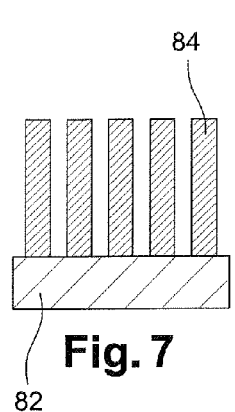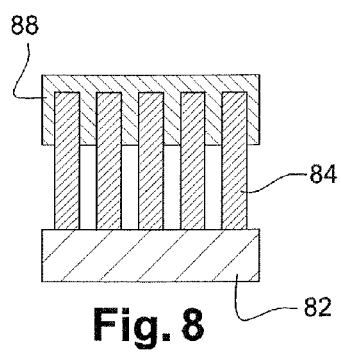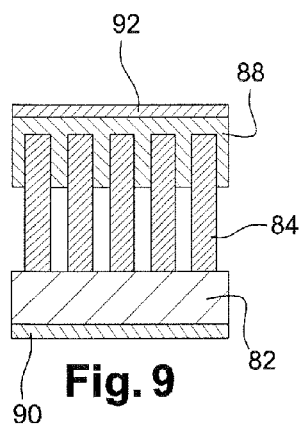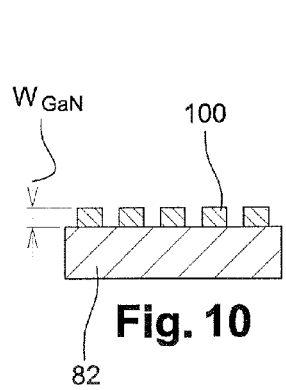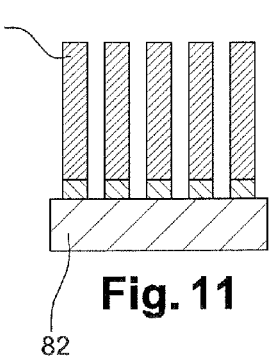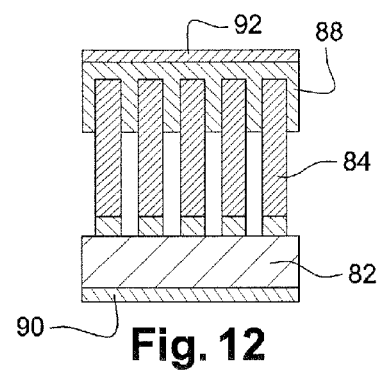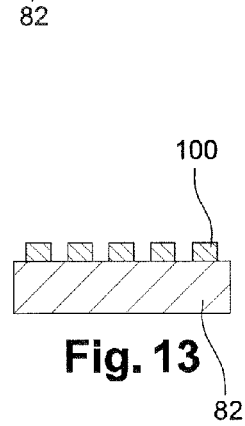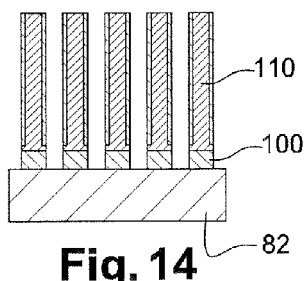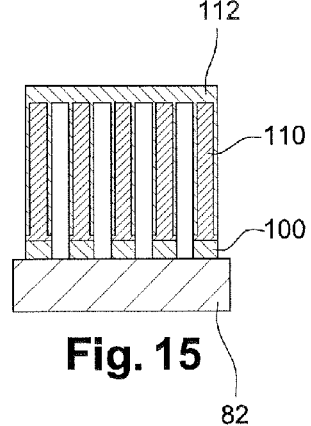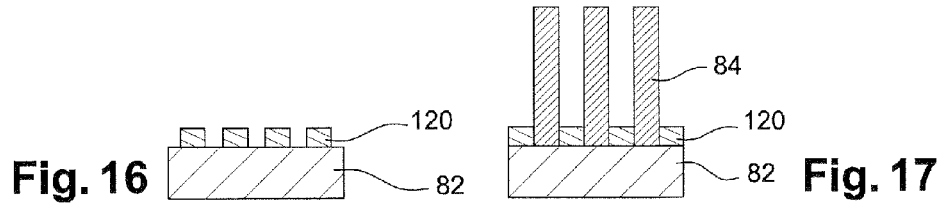

NANOWIRE-BASED OPTOELECTRONIC DEVICE FOR LIGHT EMISSION

BACKGROUND OF THE INVENTION

1. Field of the Invention

The invention relates to nanowire-based optoelectronic devices for the generation of light, especially LEDs (light-emitting diodes).

2. Description of Related Art

The "planar" technology is the technique currently implemented to form light-emitting devices, such as LEDs, based on III-V, and in particular III-N, material, and on II-VI material, such as GaN, ZnO, or GaAlAs, for example, emitting in the blue spectral domain or for a conversion into white light.

A LED in planar technology is usually formed by successive epitaxies, especially by MOCVD ("Metal-Organic Chemical Vapor Deposition"), of layers of semiconductor materials from the III-N family.

Thus, referring to FIG. 1, which is a simplified view of a planar LED 10 of the state of the art, a GaN layer 12, n-doped with silicon, is deposited on a sapphire substrate 14. An active layer 16, formed of multi-quantum wells made of an alternation of unintentionally doped GaN and InGaN sub-layers 18 and 20, is deposited on n-doped GaN layer 12. A p-doped AlGaN electron blocking layer 22, commonly called "EBL", is further deposited between active layer 16 and a GaN layer 24 p-doped with magnesium. Finally, lower and upper electric contacts 26 and 28 are respectively formed on layer 12 and on p-doped layer 24 for the electric connection of LED 10.

Thus, electrons injected into active layer 16 by means of n layer 12 and holes injected into active layer 16 by means of p layer 24 at least partly radiatively recombine in active layer 16, the quantum multi-wells having a confinement function, as known per se. Light is thus emitted by active layer 16.

The planar LED based on III-N semiconductors and on quantum wells, such as previously described, suffers from performance limitations.

Problems of electric injection and of electric confinement of the carriers are first posed.

Indeed, on the one hand, the hole mobility is very small as compared with the electron mobility, and on the other hand, holes are injected at a lower concentration than electrons due to the difficulty of activating magnesium atoms, here, the acceptors, in p-doped GaN layer 24 and to the higher resistivity of layer 24 with respect to layer 12. EBL layer 22 is thus necessary to locate radiative recombinations of electron-hole pairs in the InGaN/GaN quantum wells.

EBL layer 22 however requires to be designed with the utmost care, especially as concerns its energy bands, its hetero-epitaxial growth on a layer 16, and its ternary material composition. Indeed, a poorly designed AlGaN layer results in blocking the holes injected by p-doped layer 24 and thus in making LED 10 inefficient.

Problems of internal quantum efficiency of planar LED 10 are then posed.

A significant decrease of the LED efficiency can be observed for current densities greater than 10 A/cm$^2$ due to a phenomenon known as "Droop Efficiency", which thus rules out LEDs from many applications requiring a high current density greater than 200 A/cm$^2$, such as for example displays or lightings.

More specifically the droop efficiency phenomenon is associated with the sources of loss by non-radiative recombination of electron-hole pairs, among which the following can be mentioned:

- the displacement of charge carriers outside of indium-rich regions in InGaN/GaN multi-quantum wells;
- losses due to local dislocations and defects;
- losses by thermal effect;
- the significant piezoelectric polarization between InGaN/GaN heterostructures, which generates a spatial separation of electron-hole pairs and the appearing of interface states;
- Auger recombinations, by direct or phonon-assisted mechanisms; and
- an inefficient carrier injection due to electrons escaping from the multi-quantum wells and to the low hole concentration in these wells.

The losses are all the greater as the carrier density is high.

To decrease the droop efficiency, and thus increase the current density applicable to a LED with no significant decrease of its efficiency, the density of charge carriers in the radiative recombination area of electron-hole pairs should be decreased.

For this purpose, N. F. Gardner et al.'s article, "Blue-emitting InGaN-GaN double-heterostructure light-emitting diodes reaching maximum quantum efficiency above 200 A/cm$^2$", Applied Physics Letters 91, 243506 (2007), provides replacing the multi-quantum wells, which, by nature, induce a droop efficiency even for low current density values, with a double heterostructure such as shown in FIG. 2.

As illustrated in this simplified cross-section view of a planar LED 30, the InGaN/GaN multi-quantum wells are here replaced with a single unintentionally doped InGaN layer 32, which forms with layers 12 and 22 a double heterostructure 34.

As compared with the LED with multi-quantum wells 10 of FIG. 1, double heterostructure LED 30 has an increased efficiency for high current densities on the order of 200 A/cm$^2$. Indeed, the increase of the volume of InGaN material, where electron-hole pair recombinations occur, results in decreasing the charge carrier density, which is the main cause of the droop efficiency. This improvement has thus been demonstrated on devices emitting around 440 nanometers with a double GaN/InGaN heterostructure having a 10-nm thickness and containing approximately 14% of indium.

However, the planar LED with a double heterostructure 30 also suffers from fundamental limitations.

First, the generic problems of electric injection and of limited internal quantum efficiency specific to planar LEDs are encountered, that is, EBL layer 22 is necessary, and thus poses the same problems as previously described, and the volume of active area 32 is decreased as compared with the total volume of LED 30. Also, although double heterostructure 34 effectively solves problems inherent to the structure in the form of multi-quantum wells, it has its own specific problems.

Indeed, due to the large mesh parameter difference between the InGaN of layer 32 and the GaN of layer 12, that is, a difference of approximately 10%, it is difficult to epitaxially grow InGaN material with a high indium concentration and/or a large thickness. Indeed, beyond a thickness called "critical thickness", crystal defects appear within the InGaN material, which defects cause a substantial loss of internal quantum efficiency due to the non-radiative recombinations that they generate.

Thus, to obtain a high current density in LED 30 by increasing the InGaN volume, layer 32 should have a low indium composition, which limits the wavelengths capable of being emitted to the blue spectrum.

The planar double heterostructure thus introduces a strong antagonism between the LED emission wavelength and the possible current density with no efficiency loss.

Concurrently to planar LED technology, LEDs based on InGaN/GaN nanowires, especially manufactured by epitaxial growth, especially by MBE ("Molecular Beam Epitaxy") epitaxy, or by MOCVD epitaxy, are known.

Two categories of LEDs based on nanowires can be distinguished in the state of the art:
- those where the active area of the nanowires comprises confinement structures having multi-quantum wells with an axial epitaxial growth, that is, along the nanowire growth axis,
- and those where the active area of the nanowires comprises confinement structures having multi-quantum wells with a radial epitaxial growth, that is, in a volume formed around the nanowire growth axis.

FIG. 3 schematically shows in cross-section view an example of nanowire 40 with axial-epitaxy multi-quantum wells. Nanowire 40 is formed of a GaN area 44 n-doped with silicon, formed on an n+-doped silicon substrate 42, having an active area 46 formed of axial multi-quantum wells formed of an alternation of unintentionally doped GaN areas 48 and InGaN areas 50 formed thereon. A GaN area 52, p-doped with magnesium, is further deposited on an EBL area 54, itself deposited on active area 46.

According to this axial geometry, the electrons and the holes are injected into active area 46 respectively by means of substrate 42 and of area 52, and recombine, at least partly radiatively, in active area 46.

FIG. 4 schematically shows in cross-section view an example of nanowire 60 with multi-quantum wells grown by radial epitaxy on an n+-doped silicon substrate 62. Nanowire 60 comprises a GaN core 64 n-doped with silicon, surrounded with an active area 66 formed of radial multi-quantum wells formed of an alternation of unintentionally doped GaN areas 68 and InGaN areas 70. An EBL volume 74 surrounds active area 66, EBL volume 74 being itself surrounded with a GaN volume 72 p-doped with magnesium. Areas 66, 74, and 72 are further formed on an electric insulation layer 76.

According to this radial geometry, the electrons and the holes are injected into active area 66 respectively by means of substrate 62 and of area 72, and recombine, at least partly radiatively, in active area 66.

The nanowires, and more specifically their manufacturing method, have a number of advantages, among which:
- a growth of nanowires on substrates, each formed of a material with a mesh parameter mismatched with the other. Thus, silicon, which is a conductive low-cost substrate, capable of being manufactured in large sizes, may be envisaged for the growth of nanowires made of III-N material, which is impossible in planar technology. This variation has advantages both in terms of production cost and of simplification of manufacturing methods, especially in terms of electric injection;
- a good crystal quality due to the stress relaxation at the free surfaces. Thus, a decrease of the number of non-radiative recombination centers, and especially the absence of through dislocations, can be observed as compared with planar structures; and
- a better extraction of light with no complexification of manufacturing methods.

On the other hand, LEDs based on nanowires are less limited in terms of wavelength to be emitted than planar LEDs, since the alloy composition range forming the active layer can be expanded.

However, the LEDs based on nanowires just described also suffer from fundamental limitations.

First, whatever the geometry adopted for a nanowire-based LED of the state of the art, an EBL area is necessary to confine the carriers. Thus, in the same way as for planar LEDs, a growth perfectly controlled both in terms of morphology, of composition, of thickness, and of doping of the binary and ternary III-N semiconductors of the EBL area is indispensable.

Further, the active area here again has a decreased volume with respect to the total volume of the nanowire, which implies a limited internal quantum efficiency.

Finally, the active areas of nanowire-based LEDs of the state of the art appear in the form of multi-quantum wells. Thus, even though a better droop efficiency behavior of such LEDs as compared with planar diodes with multi-quantum wells of the state of the art would be observed, the presence of multi-quantum wells nonetheless implies a limited current density applicable to LEDs before their efficiency substantially decreases.

Document WO2009/106636 also discloses a LED based on nanowires. The nanowires, made of n-type ZnO, are epitaxially grown on a ZnO buffer layer deposited on a silicon substrate. The n-doped ZnO nanowires are further embedded in a p-doped semiconductor polymer layer, especially PEDOT/PSS, and two metal electrodes are respectively in contact with the ZnO buffer layer for electron injection and with the polymer layer for hole injection. A large p-n surface junction is thus obtained between the n-type ZnO of the nanowires and the p-type polymer layer due to the nanowire geometry.

However, the volume of active material of this type of LED, that is, the volume of material where electrons and holes radiatively recombine, is very small since this volume is limited to the interface of the p-n junctions formed of the n-type nanowires and of the p-type polymer layer.

Thus, to date, there exists no LED enabling to have, at the same time, a high current density, a high internal quantum efficiency, and a large freedom of choice as to the emitted wavelength.

SUMMARY OF THE INVENTION

The aim of the present invention is to solve the above-mentioned problems by providing an optoelectronic device having all these advantages. For this purpose, the invention aims at an optoelectronic device comprising:
- an active semiconductor area for the radiative recombination of electron-hole pairs made in the form of at least one nanowire made of an unintentionally doped semiconductor material;
- a semiconductor area for the radial injection of holes into the or each nanowire, made of a doped semiconductor material having a first conductivity type and a bandgap smaller than the bandgap of the material forming the nanowire; and
- a semiconductor area for the axial injection of electrons into the or each nanowire, made of a doped semiconductor material having a second conductivity type opposite to the first conductivity type.

"Axial injection" here means that the injection of electrons into the active area is mainly performed along the nanowire growth direction. For example, the electron injection is performed through the base of the nanowire.

"Radial injection" here means that the injection of holes into the active area is mainly carried out through the lateral surface of the nanowire. For example, the hole injection area coats the active area at least partially on a portion of its height.

"Unintentionally doped" here means a semiconductor material which has not been submitted to an extrinsic doping and which comprises at most a residual doping. This type of material is usually identified by letter "I" as opposed to extrinsically "p" and "n" doped materials.

In the following, expressions "p-doped" and "n-doped" refer to extrinsic dopings of semiconductor materials.

In other words, the fact of providing the axial injection of electrons enables to free the nanowire core for the active area, which then forms most of the nanowire volume. Indeed, due to their very high mobility, electrons occupy the entire volume of the active area despite the decreased injection surface area.

A heterojunction is further used to spatially confine carriers in the nanowire, which enables to improve the quantum efficiency of the devices. As known per se, a heterojunction comprises assembling side by side two materials having different bandgap widths. A barrier is then formed by the wide bandgap material of the hole injection material while the active area formed of the nanowire is characterized by a smaller bandgap. Thus, the carriers injected into the nanowire are confined in the nanowire due to the presence of potential barriers. The high carrier density in the active area thus increases their radiative recombination rate.

Further, due to the undoped nature of the nanowire core, a p-i-n-type structure is obtained. The nanowire thus forms an active volume where electrons and holes radiatively recombine.

Then, since the device is based on nanowires, it is possible to obtain a good confinement of charge carriers while limiting their concentration, which is the source of the droop efficiency by an appropriate selection of the nanowire height, as will be explained in further detail hereinafter.

Then, since the nanowires are not sensitive to the mesh parameter, the selection of the nanowire height, especially to obtain an appropriate current density with no droop efficiency, is decorrelated from the selection of the composition of the semiconductor forming the active area, for example, the indium composition in the case of a device based on GaN. The selection of the emission wavelength is thus wider. It is thus possible to manufacture nanowire-based LEDs emitting in the visible spectrum, especially from red to blue in the case of a LED based on GaN, or even to form a LED emitting a white light by varying the indium composition on epitaxy of the nanowire core.

Further, since the active area forms most of the nanowire volume, the device according to the invention has an improved internal quantum efficiency, even for a high injection current density.

According to a preferred embodiment of the invention, the active area is formed of a single semiconductor material. More specifically, the active area is formed of a semi-conductor material of III-V type or of II-VI type, and in particular of III-N type.

In other words, the nanowire has a structure of double heterostructure type, which enables to substantially improve the internal quantum efficiency.

Indeed, first, the volume of active material is greatly increased with respect to a multi-quantum well structure. Then, as previously discussed, the active area has a good crystal quality, and this despite a great height of the active area and/or a high In content, for example.

Further, the decrease of the number of GaN/InGaN hetero-interfaces with respect to a multi-quantum well structure, as well as the relaxation of the stress between materials of different mesh parameter (that is: InGaN/GaN), limits the piezoelectric fields within the structure at the hetero-interface level. Thus, far from interfaces, energy bands are little affected.

According to a variation of the invention:
the active area is formed of unintentionally doped InGaN;
the p-doped area is formed of p-doped GaN or of p-doped InGaN with a lower In concentration than the active area; and
the n-doped area is formed of n-doped Si or of n-doped GaN.

In a GaN-based LED, the active area is formed of InGaN, while the barrier is formed of GaN. Indeed, the incorporation of In enables to simply decrease the gap of the active area according to the following formula:

$$Eg_{In_xGa_{(1-x)}N}(x) = Eg_{InN}x + Eg_{GaN}(1-x) - 1.4x(1-x)$$

$$Eg_{In_xGa_{(1-x)}N}(x) = 0.69x + 3.5(1-x) - 1.4x(1-x)$$

For example, for an InGaN alloy containing 10% of In, the bandgap of the material is on the order of 3.1 eV, while that of GaN is equal to 3.5 eV.

According to a variation of the invention, the height of the active area has a minimum value selected according to the following relation:

$$F \cdot J_{overflow} = \left(\frac{4 \cdot N_C}{3 \cdot \sqrt{\pi}}\right)^2 \cdot \left(\frac{E_F - E_C}{k \cdot T}\right)^3 \cdot e \cdot B \cdot W_{DH}$$

where F is the nanowire filling factor, $J_{overflow}$ is the maximum current density withstood by the nanowires with no electron saturation, $N_C$ is the effective density of states of the conduction band of the material, e is the elementary charge, B is the bimolecular recombination coefficient of the material, and $W_{DH}$ is the minimum value of the height of the active area.

In other words, by selecting a sufficient height of the active area, that is, greater than the value given in the above relation, it is made sure that the device can withstand a current density having at most value $J_{overflow}$ with no loss.

According to a variation of the invention, the active area is made of InGaN, and:
the nanowires have a density ranging between $10^8$ and $10^{10}$ per square centimeter;
the nanowires have a diameter ranging between 50 nanometers and 500 nanometers; and
the height of the active area of the nanowires ranges between 40 nanometers and 5 micrometers.

More specifically, to withstand macroscopic current densities of 200 A/cm$^2$, if the nanowires have a density of $4.10^9$ cm$^{-2}$, a diameter of 100 nanometers, the minimum thickness of the active area is 40 nanometers to avoid losses by overflow.

According to an embodiment of the invention, there is no electronic blocking area between the active area and the p-doped area, thus easing the device design.

According to an embodiment of the invention, the nanowires are formed on a substrate made of n-doped semiconductor material, and the active area of the nanowire rests on the substrate, the substrate forming the electron injection area. The nanowire manufacturing thus comes down to the growth of the active area on a substrate, followed by the deposition of a p-doped layer on the free ends of the nanowires.

According to another embodiment, the nanowire comprises a base made of n-doped semiconductor material for the injection of electrons. As a variation, the nanowires are formed of a substrate which comprises a continuous layer of n-doped semiconductor material, of the same family as the material forming the active area, and supporting the nanowires, said continuous layer forming the electron injection area.

In other words, the n-doped semiconductor base of the nanowires and the n-doped continuous layer allow a wider selection of materials for the substrate.

According to an embodiment of the invention, the nanowires are formed on a substrate and the p-doped area partially coats the portion of the nanowires opposite to the substrate, especially the upper portion of the nanowires. More specifically, the p-type doped area coats less than three quarters of the nanowire periphery.

Leaving a portion of the peripheral surface of the active area free thus enables to decrease the average optical index of the light-emitting layer of the nanowire, which improves the light extraction efficiency of the device.

According to an embodiment of the invention, the hole injection area forms a planarizing material layer, which eases the subsequent deposition of an ohmic contact.

BRIEF DESCRIPTION OF THE DRAWINGS

The present invention will be better understood on reading of the following description provided as an example only, in relation with the accompanying drawings, in which the same reference numerals designate the same elements, and among which:

FIGS. 7 to 9 are simplified cross-section views illustrating a method for manufacturing the LED of FIG. 5;

FIGS. 10 to 12 are simplified cross-section views illustrating a method for manufacturing a LED according to a second embodiment of the invention;

FIGS. 13 to 15 are simplified cross-section views illustrating a method for manufacturing a LED according to a third embodiment of the invention;

FIGS. 16 to 17 are simplified cross-section views illustrating an alternative manufacturing of a LED according to the invention.

DETAILED DESCRIPTION OF THE INVENTION

Figure 5:
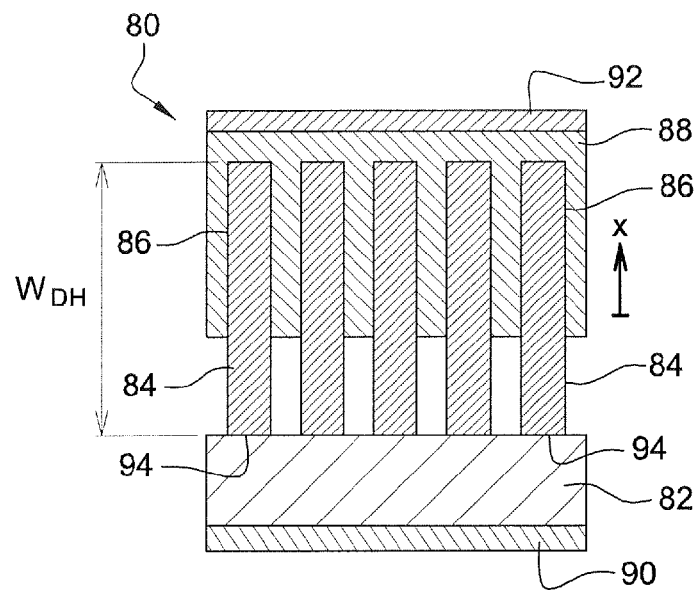
FIG. 5 is a simplified cross-section view of a LED nanowire according to a first embodiment of the invention.

Referring to FIG. 5, a LED 80 according to a first embodiment of the invention comprises an n-type silicon substrate 82, on which are formed nanowires 84 made of unintentionally doped semiconductor material from the III-V or II-VI family, preferentially from the III-N family. Nanowires 84 are coated in their upper portion 86 with a planarizing layer 88 of p-doped material from the same family as the material of nanowires 84, but having a larger energy gap to enable to inject holes from layer 88 into nanowires 84. Layer 88 is further insulated from substrate 82 to avoid any short-circuit. For example, layer 88 stops above substrate 82. Finally, upper and lower ohmic contacts 92 and 90 are respectively formed on layer 88 and under substrate 82.

LED 80 operates conventionally: electrons are injected into a nanowire 84 via substrate 82 and holes are injected into nanowire 84 via layer 88. The injected electron-hole pairs thus recombine, at least partially radiatively, in nanowire 84 which forms an active area.

It should thus be noted that LED 80 has a structure of double heterostructure type since there exists, for each nanowire 84, a first heterostructure formed of nanowire 84 and of substrate 82, and a second heterostructure formed of nanowire 84 and of layer 88.

As previously described, the fact or the electron injection to be performed axially, in the example through the base of the nanowire, is not limiting in terms of electric injection due to the high mobility of electrons. Further, any point of nanowire 84, that is, of the active area, is at a distance shorter than or equal to the radius of the nanowire. The hole injection surface is thus both very large and very close to each point of the active area.

Substrate 82 is selected to have a low resistivity, especially on the order of 0.001 ohm/cm, to ease the injection of electrons into nanowires 84, and is for example formed of n+-doped Si having a 400-nanometer thickness. This substrate may on the other hand support the epitaxy of the GaN nanowires.

Further, any type of semiconductor material capable of being energy-modulated and epitaxially grown in the form of nanowires may be part of nanowires 84 and of p-doped layer 88.

Advantageously, LED 80 is based on GaN: nanowires 84 are formed of unintentionally doped InGaN, comprising a residual n doping lower than $10^{16}$ electrons/cm$^3$, having an indium content selected according to the wavelength to be emitted by LED 80. Planarizing layer 88 is made of GaN p-doped with magnesium, or of InGaN p-doped with magnesium having an indium content lower than that of nanowires 84, the material of layer 88 having a p carrier concentration on the order of $10^{18}$ holes/cm$^3$.

As a variation, LED 80 is based on ZnO: nanowires 84 are made of unintentionally doped ZnO and p-doped layer 88 is made of ZnMgO, or the nanowires are made of unintentionally doped ZnCdO and layer 88 is made of ZnO. Still as a variation, LED 80 is based on GaAlAs, nanowires 84 are made of unintentionally doped GaAs, and p-doped layer 88 is made of GaAlAs, or the nanowires are made of unintentionally doped InGaAs, and layer 88 is made of GaAs. Still as a variation, LED 80 is based on AlInGaP, nanowires 84 are made of unintentionally doped AlGaInP, and layer 88 is made of the same material with a higher aluminum content.

Upper contact 92, which spatially delimits the macroscopic size of LED 80, for example, a 1-mm$^2$ square, may be formed of different stacks, such as for example a thin semi-transparent contact made of an Ni and Au alloy, or of indium-tin oxide (or ITO), covered with a thick comb, for example, a Ni and Au alloy to decrease its series resistance.

Lower contact 90 is deposited on the entire lower surface of the substrate and is for example made of an NiSi alloy covered with Au.

Due to its nanowire architecture, which can be formed whatever the selected type of semiconductor material due to the low influence of the mesh parameter, there is a wide choice in terms of wavelength emitted by LED 80.

On the assumption of cylindrical nanowires 84, filling factor F, equal to the ratio of the total area of the bases of the nanowires to the area of substrate 82, may be calculated according to the following relation:

$$F = \frac{\pi}{4} \cdot d^2 \cdot d_n$$

where:
d is the diameter of nanowires 84; and
$d_n$ is the surface density of nanowires 84, expressed in number of nanowires per By setting diameter d of the nanowires to 100 nm and their density to $4.10^9$ cm$^{-2}$, factor F is then equal to 0.314. Factor F enables to weight the macroscopic current density to take into account the difference between the area of the device and the sum of the base areas of the nano wires.

Due to the little influence of the mesh parameter, it is possible to verify that the height of the active area of nanowires 84 according to the desired current density $J_{overflow}$ sufficient to avoid any overflow phenomenon.

More specifically, for nanowires made of a semiconductor material assumed to be degenerated, such that $$\frac{E_F - E_C}{k \cdot T} \geq 5,$$

that is, under a strong electric injection, having height $W_{DH}$ (that is, the height of the active area), minimum value $J_{overflow}$ of the current density before obtaining a saturation of the states in the active area (or overflow current, where any additional current then cannot see the active area) is obtained according to the following relation:

$$F \cdot J_{overflow} = \left(\frac{4 \cdot N_C}{3 \cdot \sqrt{\pi}}\right)^2 \cdot \left(\frac{E_F - E_C}{k \cdot T}\right)^3 \cdot e \cdot B \cdot W_{DH}$$

where:
F is the filling factor of nanowires 84;
$N_C$ is the effective density of conduction states in the conduction band of the material of nanowires 84;
$E_F$ and $E_C$ respectively are the Fermi and conduction energy levels of the material of nanowires 84;
k is Boltzmann's constant;
T is the junction temperature (temperature of the active area) of nanowires 84;
e is the elementary charge; and
B is the bimolecular recombination coefficient of the material of nanowires 84.

A minimum height $W_{DH}$ of nanowires 84 selected in this manner results in that when a current density $J_{overflow}$ is injected into nanowires 84, the Fermi level of the double heterostructure reaches the top of the energy barrier separating energy levels $E_F$ and $E_C$. The density of charge carriers in nanowires 84 is then maximum, any additional increase of the current density causing no increase of the charge carrier density, since the latter escape from nanowires 84 without recombining. In other words, for any current density value smaller than or equal to $J_{overflow}$, carriers do not escape from nanowires 84, whereby the droop efficiency phenomenon is decreased.

Figure 6:
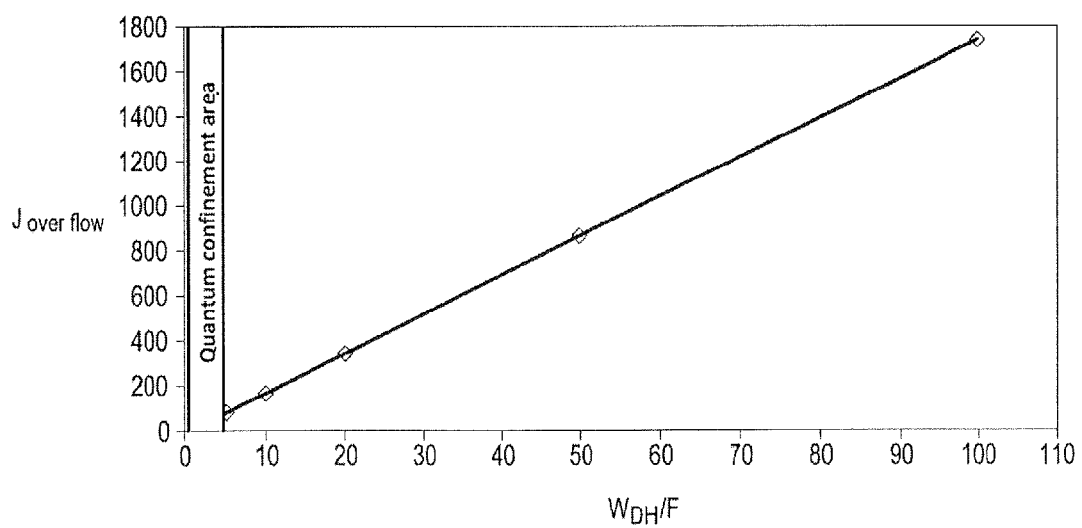
FIG. 6 is a plot of the maximum current density with no overflow in the LED of FIG. 5.

FIG. 6 is a plot of value $J_{overflow}$ versus ratio $$\frac{W_{DH}}{F}$$

for nanowires 84 made of InGaN with a 15% indium composition, for which:
Nc=$10^{18}$ cm$^{-3}$;
$E_F$–$E_C$=150 meV;
B=$10^{-11}$ cm$^3$.s$^{-1}$;
and T is the junction temperature.

It should be noted that value $J_{overflow}$ is directly proportional to ratio $$\frac{W_{DH}}{F},$$

and thus to the thickness of the active area, that is, height $W_{DH}$ of the nanowires, for a given filling factor F. This is true in the case there should be no quantum confinement, that is, for a ratio $$\frac{W_{DH}}{F}$$

greater than 5 nm. In the case of quantum wells, the energy level quantization makes the increase of the current density on the carrier escape more critical still.

Given the operating current densities desired for LEDs, typically densities greater than or equal to 200 A/cm$^2$, minimum ratio $$\frac{W_{DH}}{F}$$

may be set to 15 nm without having a significant drop of the internal quantum efficiency of LED 80.

Further, so that the confinement structure efficiently play its role, the maximum height of nanowires 84 is selected to be smaller than the carrier diffusion length. A maximum height of nanowires 84 of a few microns provides an efficient confinement.

Nanowires 84 having a minimum height of 40 nm, and thus having a maximum height which does not exceed a few micrometers, thus enable to ensure a good charge carrier confinement while avoiding the internal quantum efficiency drop due to losses by escape of carriers outside of the active area.

More specifically, for the previously-described InGaN nanowires, a current density greater than or equal to 200 A/cm$^2$ before the droop efficiency is obtained. More generally, this characteristic is achieved for nanowires 84 made of InGaN having a ratio $$\frac{W_{DH}}{F}$$

greater than 5 nanometers, or having:
a surface density $d_n$ ranging between $10^8$ and $10^{10}$, for example, a density of $4.10^9$ cm$^{-2}$;

the nanowires have a diameter d ranging between 50 nanometers and 500 nanometers, for example, a diameter of 100 nanometers; and the height of the active area of the nanowires ranges between 40 nanometers and 5 micrometers.

The nanowire structure of LED 80 also allows an internal quantum efficiency gain with respect to the state of the art due to the large volume of the active areas which form the core of nanowires 84.

Figure 3:
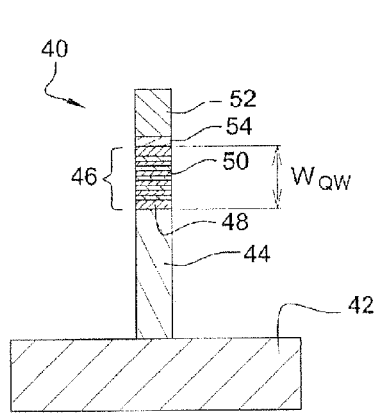
FIG. 3 is a simplified cross-section view of an axial multi-quantum well LED nanowire of the state of the art, such as described in the preamble.

For example, by comparing LED 80 according to the invention with LED 40 based on axial multi-quantum wells described in FIG. 3, and by setting a same nanowire diameter for such LEDs as well as a same surface density, the ratio of volume $V_1$ of the active area in LED 80 to volume $V_2$ of the active area in LED 40 is equal to:

$$\frac{V_1}{V_2} = \frac{W_{DH}}{nW_{QW}}$$

where:
n is the number of quantum wells in LED 40, and
$W_{QW}$ is the axial dimension of the multi-quantum wells within active area 46.

Table 1 hereafter details the value of ratio $V_1/V_2$ in different configurations:
LED 80 having an active area with a height $W_{DH}$ of 1 μm or of 100 nanometers; and
LED 40 containing five quantum wells for a thickness $W_{QW}$ equal to 2.5 nanometers.

Table 1 also details several ratios $V_1/V_2$ according to several assumptions relative to the real operation of LED 40 with multi-quantum wells, that is:

assumption 1: the radiative recombinations of electron-hole pairs occur in the entire volume of active area 46 of the nanowires;

assumption 2: the thickness of the area where radiative recombinations occur does not exceed 1 nanometer, for 2.5 nanometers of real thickness. This assumption is based on the results of N.F. Gardner et al.'s publication, "*Blue-emitting InGaN-GaN double-heterostructure light-emitting diodes reaching maximum quantum efficiency above* 200 $A/cm^2$", Applied Physics Letters 91, 243506 (2007) which demonstrate this decrease in the effective thickness of the active areas due to the presence of intense internal piezoelectric fields; and assumption 3: radiative recombinations only occur in the quantum well located closest to hole injection area 52, as in the case of planar LED structures with InGaN/GaN multi-quantum wells.

TABLE 1

|  | Assumption 1: | Assumption 2: | Assumption 3: |
|---|---|---|---|
| $W_{DH}$ = 1 μm $W_{SQ}$ = 2.5 nm | 80 | 200 | 1,000 |
| $W_{DH}$ = 100 nm $W_{SQ}$ = 2.5 nm | 8 | 20 | 100 |

This table thus clearly shows that the volume of active material is greatly increased in the LED according to the invention, from 8 to 1,000 times according to the retained assumption. Accordingly, the internal quantum efficiency of LED 80 is greatly improved with respect to a LED based on axial multi-quantum wells.

Figure 4:
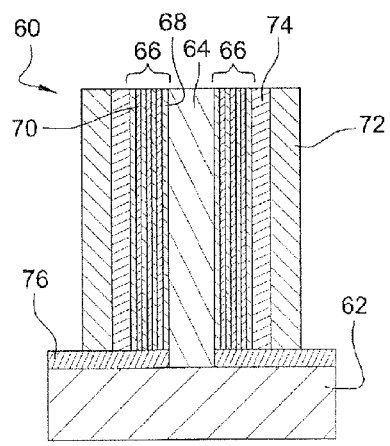
FIG. 4 is a simplified cross-section view of a radial multi-quantum well LED nanowire of the state of the art, such as described in the preamble.

Similarly, by comparing LED 80 according to the invention with LED 60 based on radial multi-quantum wells described in FIG. 4, and by setting the diameter outside of the hole injection area to be identical for both LEDs as well as their nanowire surface density, the ratio of volume $V_1$ of the active area in LED 80 to volume $V_3$ of the active area in LED 60 is equal to:

$$\frac{V_1}{V_3} = \frac{\pi \cdot R_1^2 \cdot L_1}{2 \cdot \pi \cdot R_3 \cdot L_3 \cdot n \cdot W_{QW}}$$

where:
$R_1$ is the radius of nanowires 84 of LED 80 according to the invention;
$L_1 = W_{DH}$ is the length of nanowires 84;
$R_3$ is the radius of the core of the nanowires in LED 60 based on radial multi-quantum nanowires, that is, the radius without area 72;
L3 is the nanowire height in LED 60;
$W_{QW}$ is the thickness of the multi-quantum wells in LED 60, that is, the thickness of the cylinder formed of active area 66 of LED 60; and
N is the number of quantum wells in LED 60.
Table 2 details different ratios $V_1/V_3$ for:
$R_1 = R_3 = R = 50$ nm
L1=L3
n=5 and
$W_{QW}$=2.5 nm
as well as for the assumptions as to the real operation of LED 60 such as previously described.

TABLE 2

|  | Assumption 1: | Assumption 2: | Assumption 3: |
|---|---|---|---|
| R = 50 nm | 2 | 5 | 25 |

Here again, a substantial increase of the volume gain, and thus of the internal quantum efficiency of LED 80, can be observed with respect to LED 60.

Figure 1:
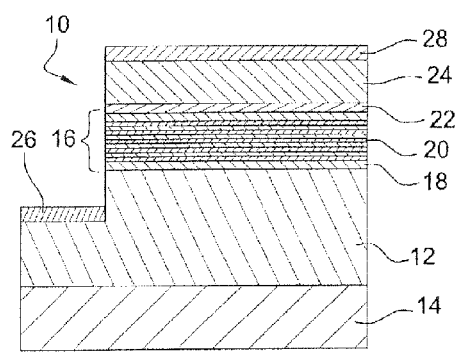
FIG. 1 is a simplified cross-section view of a planar multi-quantum well LED of the state of the art, such as described in the preamble.
Figure 2:
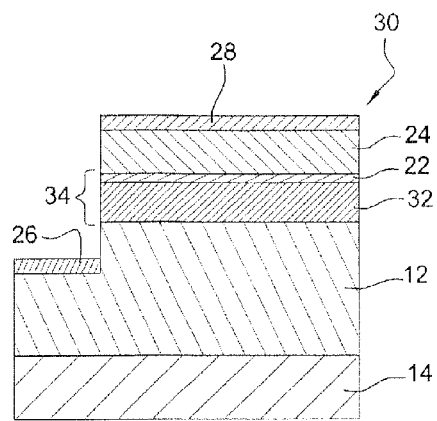
FIG. 2 is a simplified cross-section view of a planar double heterostructure LED of the state of the art, such as described in the preamble.

It should further be noted that, as compared with planar double heterostructure LED 30 described in FIG. 2, to obtain the same total volume of InGaN material in LED 80, is it sufficient to provide a height $W_{DH}$ of nanowires 84 1/F times greater than the thickness of layer 32 of LED 30. For example, when said thickness is equal to 10 nanometers, as discussed in Gardner et al.'s article, this is equivalent to a height $W_{DH}$ equal to approximately 30 nanometers for nanowires having a diameter equal to 100 nanometers and a surface density equal to $4.10^9$ cm$^{-2}$, that is, a thickness $W_{DH}$ smaller than the minimum 40-nanometer height of the nanowires such as previously discussed.

Thus, in the three cases considered hereabove, there clearly appears that the LED according to the invention comprises an active area having a greater volume than that of the state of the art.

This property generates both an increase of the internal quantum efficiency due to the higher amount of active material, and a decrease of the droop efficiency. Indeed, this phenomenon being partly linked to the Auger effect, since the density of carriers in the active area is inversely proportional to the volume of the active area and the Auger effect varies like the cube of this same density, then a large active area volume implies a strong decrease of associated non-radiative recombinations, and thus an increase of the radiative efficiency.

A method for manufacturing a LED 80 based on InGaN will now be described in relation with FIGS. 7 to 9.

The method starts with the forming of a semiconductor n-type substrate 82 having a resistivity on the order of 0.001 ohm/cm, for example, 2-inch n+-doped silicon having an approximate 400-micrometer thickness.

Then, a thick InGaN hetero-epitaxy is performed on substrate 82 to obtain nanowires 84 having a height ranging between 40 and 1,000 nanometers, and a diameter ranging between 50 and 500 nanometers, for example, a 100-nanometer diameter (FIG. 7).

The nanowire growth is for example carried out by MOCVD, by MBE, or by HVPE ("Hydride Vapor Phase Epitaxy") according to a so-called spontaneous mode or selectively. No dopant is used during the growth of InGaN, which then has a residual doping lower than $10^{16}$ electrons/cm$^3$.

The method then continues with the epitaxial growth of a layer 88 made of p-doped GaN or InGaN at the surface and at the periphery of nanowires 84 (FIG. 8), the morphology of layer 88 being controlled due to the growth conditions.

The concentration of p carriers in layer 88, for example, introduced by a magnesium doping, is selected to be on the order of $10^{15}$ holes/cm$^3$, and the indium content is either zero (GaN-p), or, if different from 0, smaller than that of the thick InGaN of nanowires 84 to ensure the carrier confinement, since the addition of indium in the active area attracts carriers.

Advantageously, a portion of the InGaN nanowires is left free, and thus remains surrounded with air, to minimize the optical index of the medium and thus improve the extraction efficiency of the device, and in all cases layer 88 is formed so as not to come into contact with substrate 82 to avoid any short-circuit.

It should be noted that it is known in the art that a change in growth parameters enables to pass from a vertical growth to a horizontal growth. Reference may for example be made to the ELOG (Epitaxy Lateral OverGrowth) growth, such as for example described in Kaponek et al.'s article [APL 71, 1204 (1997)]. In a first variation, changing the growth parameters promotes the lateral growth of the p layer to the detriment of the vertical growth to obtain a coalescence of the nanowires and, in this case, p layer 88 is said to be planarizing, thus simplifying the deposition of the upper electric contact.

In a second variation, layer 88 is not planarizing, and a step of planarization of this layer is implemented, for example, as described in document WO 2009/087319.

Lower and upper ohmic contacts 92 and 90 are then respectively deposited under substrate 82 and on layer 88 (FIG. 9).

Upper p contact 92 spatially delimits the size of the device and may be formed of different stacks, such as the stacking of a semi-transparent contact made of Ni/Au or ITO alloy and of a thicker comb of Ni/Au alloy to decrease the series resistance of the contact, such as for example described in document WO 2009/087319.

The deposition of lower n contact 90 on the rear silicon surface poses no specific problem and may for example be made of a nickel silicide.

According to a variation of the invention, a p-type GaN layer is interposed by epitaxy between nanowires 84 made of InGaN and substrate 82, which allows more choice of material for the latter.

A second embodiment is now described in relation with the manufacturing method illustrated in FIGS. 10 to 12.

This second embodiment differs from the first embodiment previously described in FIGS. 7 to 9 in that, prior to the growth of InGaN nanowires 84, GaN nanowires 100, n doped, especially with Si, are grown by epitaxy on substrate 82 across a small thickness $W_{GaN}$, for example a 100-nanometer thickness, with a concentration of n carriers close to $10^{18}$ or $10^{19}$ carriers/cm$^3$ (FIG. 10). Nanowires 84 are then grown by epitaxy on n-doped GaN nanowires 100, which form an assembly of GaN/InGaN nanowires (FIG. 11). The method then carries on as previously described to obtain a LED based on nanowires with a double heterostructure (FIG. 11).

The base of the n-doped GaN nanowires allows a wider choice for substrate 82, which may for example be formed of silicon, as for the first embodiment, or be a metal substrate for example made of copper, of an alloy based on Ni and Molybdenum. The small dimension of the nanowires enables to obtain, at the base of the nanowires, n-type GaN with better crystal properties than with the use of a buffer layer.

A third embodiment is now described in relation with the manufacturing method illustrated in FIGS. 13 to 15.

The method starts with the forming of a substrate 82 and of n-doped GaN nanowires 100, such as previously described (FIG. 13). Then, an MBE epitaxial growth of InGaN nanowires 110 is implemented on nanowires 100. Magnesium is incorporated in InGaN during the very growth of nanowires 110. A relaxation mechanism causing the spontaneous forming, by phase separation, of a so-called "core/shell" where an undoped InGaN core forms and is surrounded with an external GaN shell n-doped with magnesium (FIG. 14). An increase of the surface of the InGaN volume in contact with the volume of p-doped GaN is thus obtained.

The method then carries on with the growth and the coalescence of a p-doped GaN layer 112 at the free end of nanowires 110 (FIG. 15), after which ohmic contacts are deposited, optionally with a planarization step, such as previously described in relation with the first embodiment.

FIGS. 16 and 17 illustrate an alternative embodiment applicable to all the manufacturing methods just described.

Especially, in this variation, a growth mask 120 made of an electrically insulating material inert towards the epitaxial growth of GaN or of InGaN, such as for example a silicon nitride or silica mask, is deposited on substrate 82 (FIG. 16). The method then carries on with the forming of nanowires 84 made of InGaN or GaN/InGaN nanowires such as previously described (FIG. 17), and then of the p-doped GaN layer and of the ohmic contacts. This alternative manufacturing enables to accurately control the diameter of the nanowires as well as the spacing therebetween to optimize the extraction efficiency of the light generated by the LED.

According to another embodiment, the indium content of the nanowires varies according to their height. For example, the indium content increases all along the wire. Such a configuration may decrease the mechanical stress by progressive adaptation of the mesh parameter.

Figure 18:
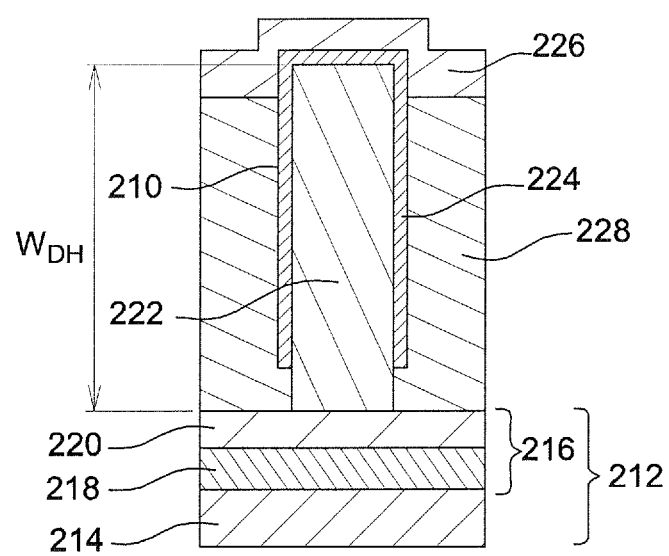
FIG. 18 is a simplified cross-section view of a LED nanowire according to a variation of the invention.

An alternative embodiment of the present invention is described in relation with the simplified cross-section view of FIG. 18. In this drawing, a nano-LED 210 is formed on a portion of a support 212 comprising a common insulating substrate 214, having an electrically conductive layer 216, for example, metallic or doped semiconductor, deposited thereon.

As a variation, layer 216 comprises a first electrically conductive layer 218 deposited on substrate 214 and having an n-doped layer 220 made of GaN formed thereon.

Support portion 212 is for example made of a metal or of a doped semiconductor.

Nano-LED 210 comprises a core 222 made of a semiconductor material from the III-V or II-VI family, preferably the III-N family. Core 222 is coated at least on its upper portion with a shell 224 made of a p-doped semiconductor material from the same family as that of the material of core 222, but having a larger energy gap to enable to inject holes from shell 224 to core 222.

Shell 224 is preferably insulated from support 212 to avoid any short-circuit between an upper electric contact 226 and lower conductive layer 216. For example, shell 224 stops above support 212.

Finally, nano-LED 210 is embedded in an insulating planarizing layer 228, except as concerns its head, and upper electric contact 226 formed on planarizing layer 228.

Upper electric contact 226 is semi-transparent to the emission wavelength of nano-LED 210 and may be formed of different stacks, such as for example a semi-transparent contact made of thin layers of Ni and Au, or again of indium-tin oxide (or ITO). It may be locally covered with a thick comb, for example thicker Ni and Au layers to decrease its series resistance.

Methods have just been described in the case of a LED based on GaN. Of course, other types of material may be used.

The invention claimed is:

1. A light-emitting diode comprising:
a plurality of nanowires formed directly on a substrate, said nanowires being made of an unintentionally doped semiconductor material, wherein said nanowires form an active semiconductor area, along an entire height of each of said nanowires, for radiative recombination of electron-hole pairs;
a continuous first semiconductor area for radially injecting holes into each of said nanowires and partially coats a portion of each of said nanowires opposite to said substrate without contacting said substrate, said continuous first semiconductor area being made of a doped semiconductor material having a first conductivity type and having a bandgap that is greater than a bandgap of the unintentionally doped semiconductor material forming said nanowires; and
a second semiconductor area for axially injecting electrons into each of said nanowires, said second semiconductor area being made of a doped semiconductor material having a second conductivity type that is opposite to that of the first conductivity type;
an upper ohmic electrode formed on the continuous first semiconductor area and a lower electrode formed in contact with the substrate;
wherein the active semiconductor area for the radiative recombination of electron-hole pairs is made of a single semiconductor material;
wherein the single semiconductor material of the active semiconductor area for the radiative recombination of electron-hole pairs is one of a III-V type semiconductor material, a II-VI type semiconductor material and a III-N type semiconductor material;
wherein the continuous first semiconductor area for radially idectin holes is formed of p-doped GaN or p-doped InGaN;
wherein the second semiconductor area for axially injecting electrons is formed of n-doped Si or n-doped GaN; and
wherein the height of the active semiconductor area for the radiative recombination of electron-hole pairs has a minimum value determined according to the following relationship:

$$F \cdot J_{overflow} = \left(\frac{4 \cdot N_C}{3 \cdot \sqrt{\pi}}\right)^2 \cdot \left(\frac{E_F - E_C}{k \cdot T}\right)^3 \cdot e \cdot B \cdot W_{DH}$$

wherein F is the nanowire filling factor, $J_{overflow}$ is the maximum current density withstood by said nanowires with no electron saturation, $N_C$ is the effective density of states of the conduction band of the nanowire material, e is the elementary charge, B is the bimolecular recombination coefficient of the nanowire material, and $W_{DH}$ is the minimum value of the height of the active semiconductor area, and the height of the active semiconductor area for the radiative recombination of electron-hole pairs of said nanowires ranges between 40 nanometers and 5 micrometers.

2. The light-emitting diode of claim 1,
wherein the continuous first semiconductor area for radially injecting holes formed of p-doped InGaN has a lower In concentration than that of the active semiconductor area.

3. The light-emitting diode of claim 1, wherein the active semiconductor area for the radiative recombination of electron-hole pairs is made of InGaN;
wherein said nanowires have a density ranging between $10^8$ and $10^{10}$ per square centimeter; and
wherein said nanowires have a diameter ranging between 50 nanometers and 500 nanometers.

4. The light-emitting diode of claim 3, wherein said nanowires have a density of $4.10^9$ cm$^{-2}$, a diameter of 100 nanometers, and the active semiconductor area height is 40 nanometers.

5. The light-emitting diode of claim 1, wherein there is no electronic blocking area between the active semiconductor area and the continuous first semiconductor area.

6. The light-emitting diode of claim 1, wherein said nanowires are formed on a substrate made of n-doped semiconductor material, and the substrate forms the second semiconductor area for axially injecting electrons.

* * * * *